(12) United States Patent
Kirsch

(10) Patent No.: US 6,483,767 B2
(45) Date of Patent: Nov. 19, 2002

(54) METHOD OF CONSTRUCTING A VERY WIDE, VERY FAST DISTRIBUTED MEMORY

(75) Inventor: Graham Kirsch, Hants (GB)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/867,520

(22) Filed: May 31, 2001

(65) Prior Publication Data

US 2002/0024874 A1 Feb. 28, 2002

Related U.S. Application Data

(62) Division of application No. 09/642,781, filed on Aug. 22, 2000, now Pat. No. 6,359,827.

(51) Int. Cl.[7] .............................................. G11C 8/00
(52) U.S. Cl. ........................ 365/230.06; 365/230.01; 365/230.08; 711/169
(58) Field of Search ................. 365/230.06, 230.08, 365/230.01; 711/169, 140

(56) References Cited

U.S. PATENT DOCUMENTS

| | | | | |
|---|---|---|---|---|
| 5,537,564 A | * | 7/1996 | Hazanchuk et al. | ... 365/230.03 |
| 5,579,267 A | * | 11/1996 | Koshikawa | ............ 365/230.07 |
| 5,638,533 A | | 6/1997 | Law | |
| 5,727,229 A | | 3/1998 | Kan et al. | |
| 5,809,539 A | * | 9/1998 | Sakakibara et al. | ......... 711/151 |
| 5,926,839 A | * | 7/1999 | Katayama | .............. 365/230.08 |
| 6,005,823 A | * | 12/1999 | Martin et al. | .......... 365/230.03 |
| 6,061,367 A | | 5/2000 | Siemers | |
| 6,202,139 B1 | * | 3/2001 | Witt et al. | ............. 365/230.05 |
| 6,282,603 B1 | * | 8/2001 | Rao | ........................... 365/203 |

FOREIGN PATENT DOCUMENTS

WO     WO 93/08526     4/1993

OTHER PUBLICATIONS

Michael J. Flynn, "Very High–Speed Computing Systems," Proceedings of the IEEE, vol. 54, No. 12, Dec. 1966, pp. 1901–1909.

* cited by examiner

*Primary Examiner*—Richard Elms
*Assistant Examiner*—Van Thu Nguyen
(74) *Attorney, Agent, or Firm*—Dickstein Shapiro Morin & Oshinsky LLP

(57) ABSTRACT

A memory core with an access time that does not include a delay associated with decoding address information. Address decode logic is removed from the memory core and the address decode operation is performed in an addressing pipeline stage that occurs during a clock cycle prior to a clock cycle associated with a memory access operation for the decoded address. After decoding the address in a first pipeline stage, the external decode logic drives word lines connected to the memory core in a subsequent pipeline stage. Since the core is being driven by word lines, the appropriate memory locations are accessed without decoding the address information within the core. Thus, the delay associated with decoding the address information is removed from the access time of the memory core.

7 Claims, 6 Drawing Sheets

METHOD OF CONSTRUCTING A VERY WIDE, VERY FAST DISTRIBUTED MEMORY

This application is a divisional of U.S. application Ser. No. 09/642,781, filed Aug. 22, 2000, the entirety of which is incorporated herein by reference now U.S. Pat. No. 6,359,827.

BACKGROUND OF THE INVENTION

1. Field of the Invention

The present invention relates to the field of semiconductor devices and, more particularly to a very wide, very fast distributed memory and a method of constructing the same.

2. Description of the Related Art

In certain processor-based applications there is a need for a very wide memory having relatively few memory locations that are distribute throughout a single chip. For example, in a single instruction, multiple data (SIMD) massively parallel processor (MPP) array, a very large number of processing elements(PEs) each typically contain a register file. The register file typically contains only a few memory words (e.g., sixty-four) organized as a single column of one word rows. Because all of the PEs execute the same instruction at a time, they all use the same address to access its respective register file. In addition, each register file is read from or written to at essentially the same time. In effect, the distributed register files act as a single, very wide memory device.

It is impractical to implement this very wide memory as a single random access memory (RAM) array core. Such a large memory would be very slow and the routing difficulties associated with connecting thousands of data lines through the chip would be formidable. Therefore, several smaller memory cores are needed, with each core serving a small group of PEs. The use of several smaller memory cores, however, is not without its shortcomings. For instance, the address decoding logic responsible for decoding an address and selecting the appropriate word to be accessed from the memory array has to be repeated for every core, which takes up precious space on the chip.

A normal memory core 10 is illustrated in FIG. 1. A decode circuit 12 is positioned to one side of the memory bit array 20 and sense amplifiers and other select logic 30 are positioned beneath the array 20. Note that the address lines 14 are driven in vertically, along the length of the decoder circuit 12, to the decode logic 16 within the decode circuit 12. The address lines 14 are decoded by the decode circuit 12 and converted into a word line number/address corresponding to one of the word lines 18 in the core 10. A word select signal is then driven across the word line 18 and through the memory array 20 to activate the appropriate word or row of memory within the array 20.

For a read operation, the activated row couples all of the memory cells corresponding to the word line 18 to respective bit lines 22, which typically define the columns of the array 20. It should be noted that a register file typically consists of a single column and that column address decoding is typically not required. For a dynamic random access memory (DRAM), when a particular row is activated, the sense amplifiers 30 connected to the bit lines 22 detect and amplify the data bits transferred from the array 20 by measuring the potential difference between the activated bit lines 22 and a reference line (which may be an inactive bit line). As is known in the art, for a static random access memory (SRAM), the sense amplifier circuitry 30 would not be required. The read operation is completed by outputting the accessed data bits over input/output (I/O) lines 32.

Since the typical memory core 10 contains the decode circuit 12 and performs the address decode operation as part of the memory access operation (e.g., data read or write), the core 10 has a relatively long access time. FIG. 2 illustrates an example of a timing diagram for the conventional memory core 10 illustrated in FIG. 1. For this example it is presumed that the memory core 10 is a SRAM device. The core 10 is driven by a clock signal CLOCK, and the read operation begins at time $t_0$ and ends at time $t_1$. The typical access time $t_{access}$ for the conventional memory core 10 includes the time required for the memory core circuitry to properly latch the address signals $t_{hold}$ (often referred to as the "hold time"), the time required to decode the address lines $t_{adec}$, the time required to drive the corresponding word line(s) $t_{wrd}$, the time required to drive the bit lines $t_{bit}$, and the time required by the output logic to output the accessed information $t_{op}$. Thus, for the conventional memory core 10 (FIG. 1), the access time $t_{access}$ is calculated as follows:

$$t_{access} = t_{hold} + t_{adec} + t_{wrd} + t_{bit} + t_{op}. \tag{1}$$

It is desirable to reduce the access time $t_{access}$ of the memory core so that the core could be used in a very wide, very fast, distributed memory device. It is also desirable to reduce the access time $t_{access}$ of the memory core so that the core could be used as a very wide, very fast, distributed register file in a SIMD MPP device.

Accordingly, there is a desire and need for a memory core having a substantially reduced access time so that the core can be implemented in a very wide, very fast, distributed memory device.

SUMMARY OF THE INVENTION

The present invention provides a memory core having a substantially reduced access time.

The present invention also provides a very wide, very fast, distributed memory device.

The present invention also provides a very wide, very fast, distributed register file in a SIMD MPP device.

The above and other features and advantages of the invention are achieved by providing a memory core with an access time that does not include a delay associated with decoding address information. Address decode logic is removed from the memory core and the address decode operation is performed in an addressing pipeline stage that occurs during a clock cycle prior to a clock cycle associated with a memory access operation for the decoded address. After decoding the address in a first pipeline stage, the external decode logic drives word lines connected to the memory core in a subsequent pipeline stage. Since the core is being driven by word lines, the appropriate memory locations are accessed without decoding the address information within the core. Thus, the delay associated with decoding the address information is removed from the access time of the memory core.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF PREFERRED EMBODIMENTS

In an exemplary embodiment, the present invention is utilized as a register file for the PEs of a SIMD MPP memory device. In this exemplary embodiment, the SIMD MPP device utilizes an address pipeline allowing the SIMD MPP to operate based on pipelined row addresses. As known in the art, a pipeline reduces the number of clock cycles needed to perform an operation because portions of the operation are being spread out through the pipeline. Typically, the desired operation is then performed in one clock cycle since all of the setup required by the operation has already been performed in the pipeline. Thus, an address pipeline will reduce the number of clock cycles needed to obtain the row address and supply it to the memory core (where the memory core would subsequently decode the row address, drive the appropriate word line and then access the addressed memory location).

The present invention capitalizes on the address pipeline by 1) placing the decode circuitry outside of the memory core; 2) inserting the decoding operation within the address pipeline; and 3) driving the appropriate word line from the pipeline (which is external to the memory core). Thus, the word lines of the memory core are driven by external logic, which reduces the access time $t_{access}$ of the core by the delay normally associated with the decode operation $t_{adec}$. It should be noted that the present invention is not limited to its use within a SIMD MPP. Rather the invention can be utilized within any memory device that uses an address pipeline, or that can implement an address pipeline.

Figure 3:
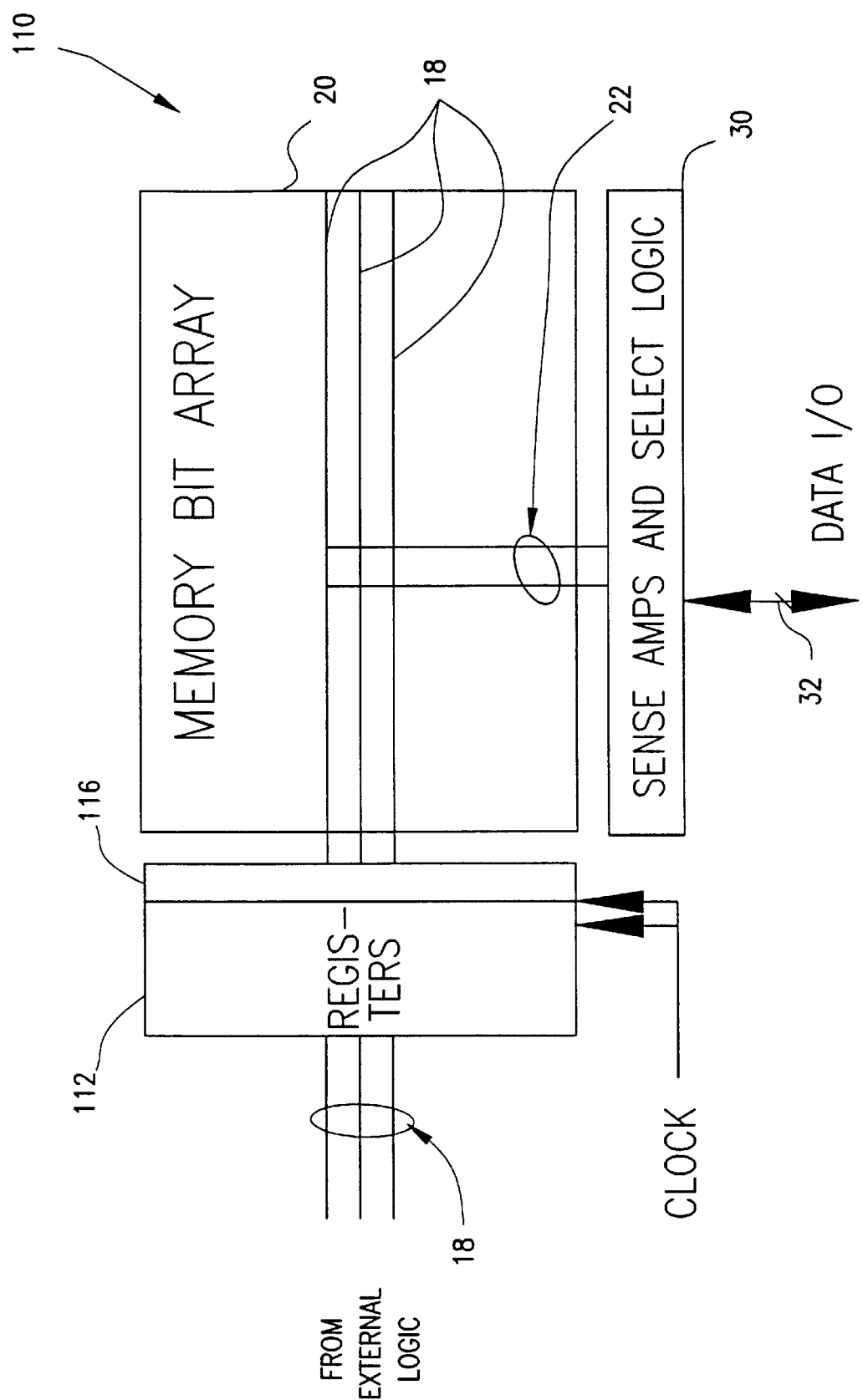
FIG. 3 is a block diagram illustrating an exemplary memory core constructed in accordance with an exemplary embodiment of the invention.

FIG. 3 illustrates an exemplary memory core 110 constructed in accordance with an embodiment of the invention. Unlike the conventional memory core 10 (FIG. 1), the memory core 110 of the present embodiment does not contain any decode circuitry. Instead, the word lines 18 of the memory core 110 are driven by external decode logic (not shown) through registers 112, which serve as a last stage in the address pipeline. As noted earlier, if the present invention is to be utilized as a register file, column address decoding is not required (because a register file typically consists of a single column of words/rows).

Rather than drive an encoded address to the memory array 20, all fully decoded word lines 18 are driven from the external logic. The word lines 18 are registered (via registers 112) on the rising edge of the clock CLOCK, and driven across the memory bit array 20. There are as many word lines 18 as there are memory words/rows in the array 20. It should be noted that some logic or timing circuitry 116 may be needed after the registers 112 to control the shape or timing of the signals traversing the word lines 18.

For a read operation, for example, the driven word line 18 activates a row, which couples all of the memory cells corresponding to the row to respective bit lines 22. If the memory array 20 is a DRAM memory array, sense amplifiers 30 connected to the bit lines 22 detect and amplify the data bits transferred from the array 20 by measuring the potential difference between the activated bit lines 22 and a reference line (which may be an inactive bit line). As is known in the art, for a static random access memory (SRAM), the sense amplifier circuitry 30 would not be required. The read operation is completed by outputting the accessed data bits over input/output (I/O) lines 32.

Figure 5:
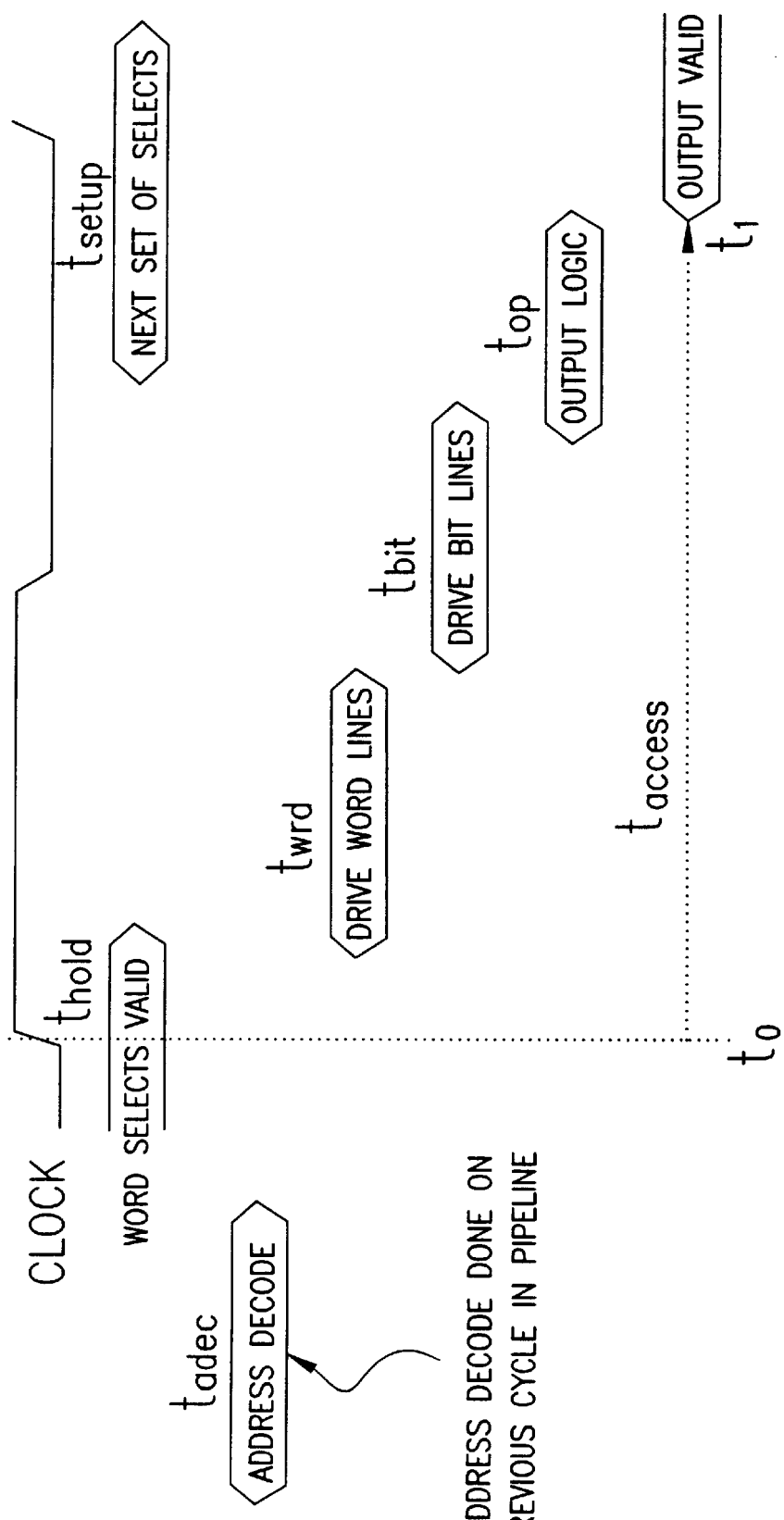
FIG. 5 is a timing diagram illustrating the access time for a read operation in the memory core circuit constructed in accordance with an embodiment of the invention.

FIG. 5 is a timing diagram illustrating the timing of the memory core 110 (FIG. 3) constructed in accordance with an embodiment of the invention. For this example it is presumed that the memory core 110 is an SRAM device. The core 110 is driven by a clock signal CLOCK, and the read operation begins at time $t_0$ and ends at time $t_1$. The typical access time $t_{access}$ for the memory core 110 includes the time required for the memory core circuitry to properly process the word select signal received on the driven word line 18 $t_{hold}$, the time required to register and drive the corresponding word line(s) within the core 110 $t_{wrd}$, the time required to drive the bit lines $t_{bit}$, and the time required by the output logic to output the accessed information $t_{op}$. Thus, for the memory core 110 of the present invention (FIG. 3), the access time $t_{access}$ is calculated as follows:

$$t_{access} = t_{hold} + t_{wrd} + t_{bit} + t_{op}. \quad (2)$$

Figure 1:
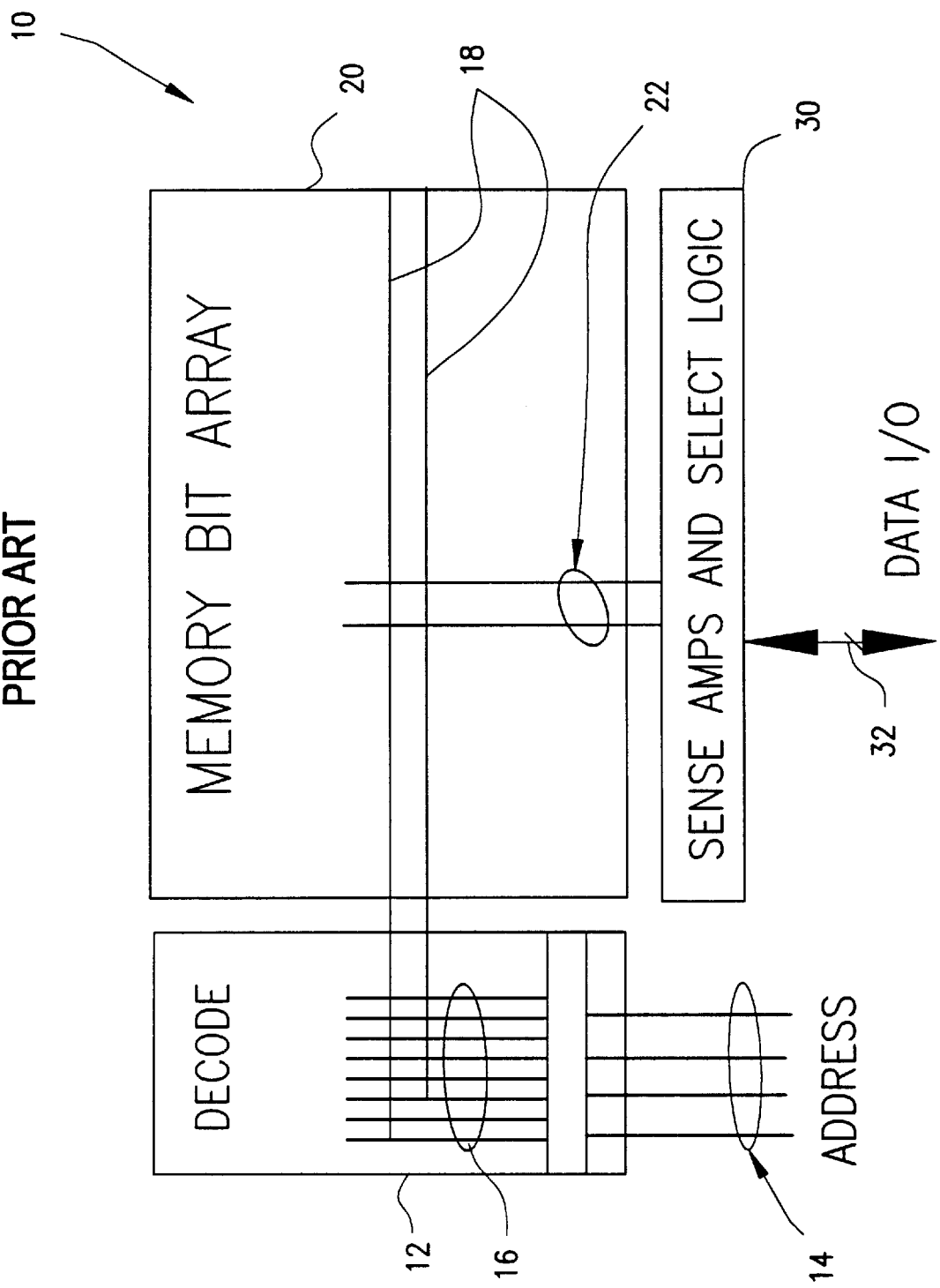
FIG. 1 is a block diagram illustrating a conventional memory core circuit.
Figure 2:
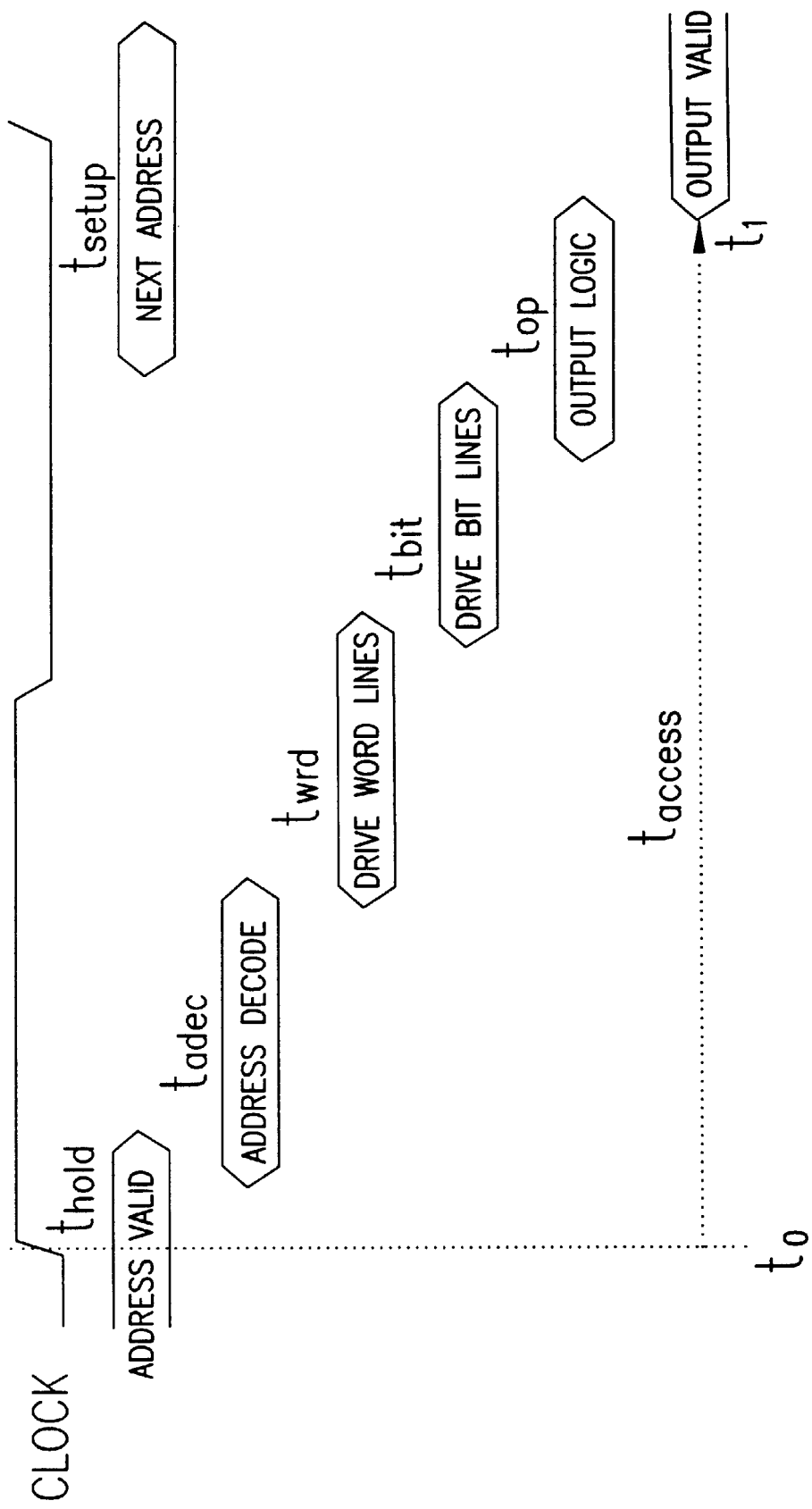
FIG. 2 is a timing diagram illustrating the access time for a read operation in a conventional memory core circuit.

It should be noted that the time required to decode the address lines $t_{adec}$ is not within the access time $t_{access}$ of the memory core 110 since the decode operation is being performed in a prior pipeline stage (i.e., prior to time $t_0$). Thus, the access time $t_{access}$ of the memory core 110 of the present embodiment is much faster than the access time of the prior art memory core 10 (FIG. 1). Thus, the words in the memory core 110 can be selected faster and, because only two bits of the word lines will change at any one time, the power consumption will be reduced.

Figure 4:
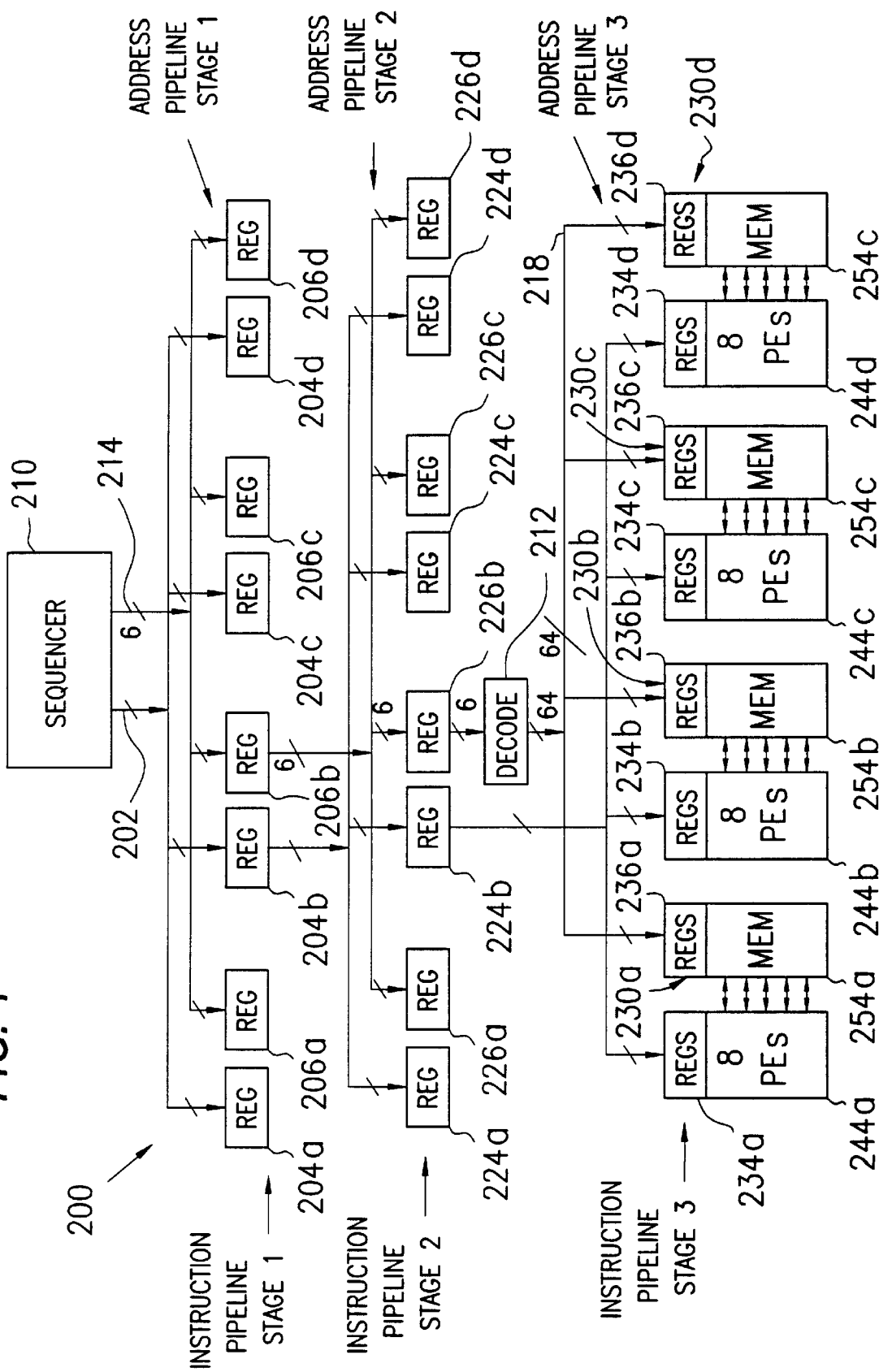
FIG. 4 is a block diagram illustrating an exemplary memory device constructed in accordance with an exemplary embodiment of the invention.

FIG. 4 is a block diagram illustrating an exemplary memory device 200 constructed in accordance with an exemplary embodiment of the invention. In the illustrated example of FIG. 4, the memory device 200 is a SIMD MPP. The memory core and pipelined decoding scheme of the present invention are used to implement register files 230a, 230b, 230c, 230d (collectively referred to herein as "register files 230") for the blocks of PEs 244a, 244b, 244c, 244d (collectively referred to herein as "PEs 244") within the device 200.

Register files 230 are typically used for high speed local storage by the PEs 244. The register files 230 can also be used as a scratch pad or cache depending upon how the PEs 244 are programmed. It is important in a SIMD MPP device 200 that the register files 230 be very fast, single-cycle memory since the PEs typically process instructions in a single clock cycle. It must be noted that the device 200 illustrated in FIG. 4 is but one example of how the present invention can be implemented into a SIMD MPP or similar memory device. The exact architecture of the device 200 is not important and the invention is not to be limited solely to the architecture illustrated in FIG. 4.

In the illustrated example, each register file 230a, 230b, 230c, 230d includes a block of memory arrays 254a, 254b, 254c, 254d (collectively referred to herein as "memory arrays 254") comprising SRAM memory cells (thus, sense amplifier circuitry is not needed and not illustrated in FIG. 4). In the illustrated example, the blocks of memory arrays 254 are organized as eight arrays (one per PE) containing sixty-four rows of 64-bit words. It should be noted that any number of rows (e.g., 2, 4, 8, 16, 32, 64, 128, 256, etc.) could be used and the invention is not to be limited to 64 rows. The primary limitation effecting the number of rows in the arrays 254 is the amount of wiring to be routed within the chip (i.e., the number of word lines routed to the register files 230 is dependent upon the number of rows in the memory arrays).

The device 200 comprises a sequencer 210 coupled to a three stage address pipeline by address lines 214, and to a three stage instruction pipeline by instruction lines 202. It should be noted that there are six address lines 214 illustrated in this example because there are only sixty-four rows in the register files 230. If there were more rows, then there would be more address lines 214. If there were less rows, then there would be less address lines 214. The device 200 utilizes memory arrays 254 containing SRAM memory cells, but it should be apparent that DRAM or other types of RAM may be used as well. If DRAM cells were used, then the device 200 would also contain sense amplifier circuitry.

The device 200 contains four instruction stage 1 registers 204a, 204b, 204c, 204d (collectively referred to herein as "instruction stage 1 registers 204") in stage 1 of the instruction pipeline. The instruction stage 1 registers 204 are each connected to the sequencer 210 by the instruction lines 202. Each instruction stage 1 register 204 fans out into four instruction stage 2 registers 224a, 224b, 224c, 224d (collectively referred to herein as "instruction stage 2 registers 224"). Each instruction stage 2 register 224 fans out into four instruction stage 3 registers 234a, 234b, 234c, 234d (collectively referred to herein as "instruction stage 3 registers 234"), which are connected to respective blocks of PEs 244a, 244b, 244c, 244d. Thus, all in all, there will be sixty-four blocks of PEs 244 in the device 200. Each block of PEs contains 8 PEs and thus, there is a total of 1024 PEs in the device 200. It should be noted that any number of PEs or pipeline stages could be used and the invention is not to be limited to a particular number of PEs or pipeline stages. The instructions for the PEs 244 are broadcast by the sequencer 210 into the instruction pipeline, where after the third stage, are input into, and processed by, the blocks of PEs 244. Since this is a SIMD MPP, all of the PEs within the blocks of PEs 244 operate on the same instruction.

The device 200 contains four address stage 1 registers 206a, 206b, 206c, 206d (collectively referred to herein as "address stage 1 registers 206") in stage 1 of the address pipeline. The address stage 1 registers 206 are connected to the sequencer 210 by the address lines 214. Each address stage 1 register 206 fans out into four address stage 2 registers 226a, 226b, 226c, 226d (collectively referred to herein as "address stage 2 registers 226"). Each address stage 2 register 226 fans out into four address stage 3 registers 236a, 236b, 236c, 236d (collectively referred to herein as "address stage 2 registers 236"), which are connected to respective blocks of memory arrays 254a, 254b, 254c, 254d. Thus, all in all, there will be sixty-four blocks of memory arrays 254 in the device 200, one block 254 for each block of PEs 244. The address for the memory location within the register files 230 are broadcast by the sequencer 210 into the address pipeline.

After the second stage in the address pipeline, a decode circuit 212 decodes the 6-bit address into its corresponding word line address. The decode circuit 212 then drives the word line 218 corresponding to the word line address. At stage 3 of the address pipeline, the driven word line 218 is input into the address stage 3 registers 236, which then drive the word lines into the memory arrays 254. Since this is a SIMD MPP, all of the PEs 244 access the same memory location within the register files 230.

At first sight it might appear that it is much more difficult to route sixty-four word lines 218 than six address lines 214. However, note that the memory cores (i.e., register files 230) are placed in a regular repeating pattern, which makes the routing of the word lines 218 very easy. The word Lines simply have to run over the memory cells of the arrays 254 and drop down to the inputs of the registers 236.

It should be appreciated that the device 200 illustrated in FIG. 4 uses a four by four by four pipeline configuration for both the address and instruction pipelines, but that any pipeline configuration could be used. For example, the device 200 could use a different pipeline configuration for the address pipeline than the instruction pipeline. Either or both of the pipelines could be configured as an eight by two by eight pipeline. Moreover, it should be apparent that more stages could also be included within the pipelines if desired. It should also be apparent that less pipeline stages could be used if so desired and that the invention is not to be limited to the number of pipeline stages illustrated in the exemplary embodiments.

The decode circuit 212 was placed between the second and third stages of the address pipeline. It should be apparent, that the decode circuit 212 could be placed between the first and second stages of the address pipeline, if so desired. Moreover, the decode circuit 212 could even be placed within the sequencer 210. As long as the decode circuitry is placed external to the memory cores (i.e., register files 230 in FIG. 4) and performed prior to the memory access operation (FIG. 5), the precise location of the circuit 212 is irrelevant. It should be noted, however, that the earlier the decode operation is performed in the pipeline, the earlier sixty-four word lines have to be routed throughout the chip. Thus, placing the decode circuit 212 between the first and second stages of the address pipeline would require the routing of sixty-four word lines to the registers 226,236 in the second and third stages of the address pipeline (as opposed to solely the registers 236 in the third stage). Although the device 200 would still reap the operational benefits of the present invention, the increased number of wires may make take up too much space on the final device 200. Thus, the placement of the decode circuit 212 between the second and third stages of the address pipeline is desirable. If the address pipeline consisted of only two stages, then the placement of the decode circuit 212 between the first and second stages of the address pipeline is desirable.

Figure 6:
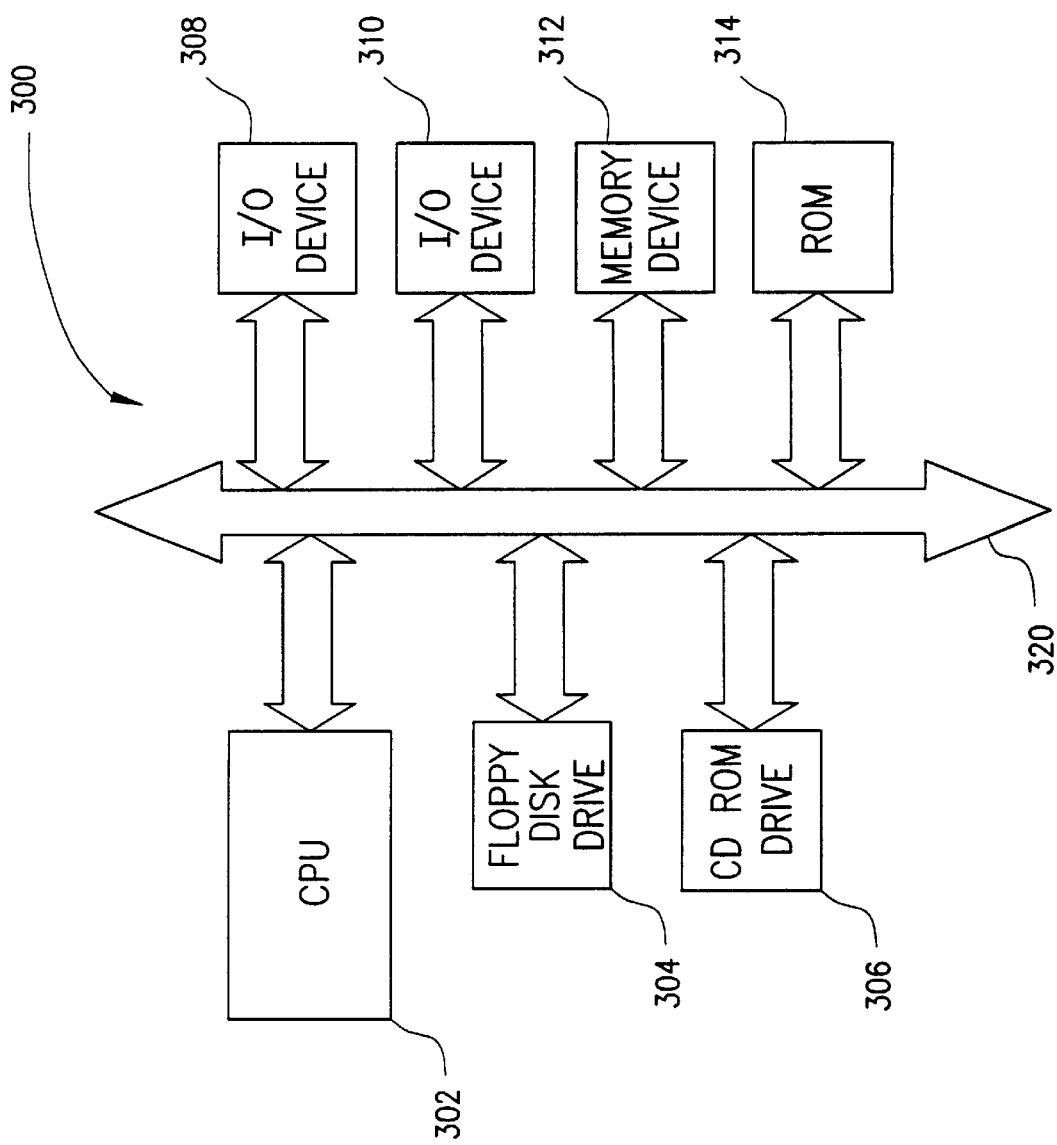
FIG. 6 is a block diagram of an exemplary processor-based system utilizing a memory device constructed in accordance with an embodiment of the invention.

A memory device 312 containing the memory core and address decoding scheme of the present invention may be used in a processor-based system 300 of the type shown in FIG. 6. The processor-based system 300 comprises a processor 302 that communicates with the memory device 312 and an I/O device 308 over a bus 320. It must be noted that the bus 320 may be a series of buses and bridges commonly used in a processor-based system, but for convenience purposes only, the bus 320 has been illustrated as a single bus. The memory device 312 contains the memory core without decode circuitry (FIG. 3) of the present invention. The memory device 312, which may be a SIMD MPP (FIG. 4) or any other type of DRAM or SRAM utilizing an address pipeline. In addition, the processor 302 may itself be an integrated processor which utilizes on-chip memory devices containing the circuitry of the present invention.

The processor-based system 300 may be a computer system, a process control system or any other system employing a processor and associated memory. A second I/O device 310 is illustrated, but is not necessary to practice the invention. The processor-based system 300 may also include read-only memory (ROM) 314 and may include peripheral devices such as a floppy disk drive 304 and a compact disk (CD) ROM drive 306 that also communicate with the processor 302 over the bus 320 as is well known in the art.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A massively parallel processor device comprising:
   a sequencer for outputting address signals corresponding to a memory location;
   an address pipeline connected to said sequencer, said pipeline receiving the address signals and decoding the address signals into a word line address, said address pipeline driving an activation signal on a plurality of word lines corresponding to said word line address;
   a plurality of register files having a memory array, each register file receiving said activation signal on a respective one of said plurality of word lines and accessing memory cells from its memory array at said memory location; and
   a plurality of processor elements, each processor element connected to a respective register file, wherein said address pipeline comprises:
      a decode circuit, said decode circuit decoding the address signals into said word line address and driving said activation signal on said plurality of word lines, and
      first and second pipeline stages, said first pipeline stage receiving the address signals and outputting them to said second pipeline stage, said second pipeline stage receiving the address signals from said first pipeline stage and outputting them to said decode circuit.

2. The massively parallel processor device of claim 1, wherein each register file comprises:
   a third pipeline stage connected to said decode circuit by a plurality of first word lines, said third pipeline stage receiving said activation signal on a first word line corresponding to said word line address and outputting a pipelined activation signal on one of a plurality of second word lines, and
   wherein said memory array receives said pipelined activation signal from said third pipeline stage and accesses said memory cells based on said pipelined activation signal.

3. A massively parallel processor device comprising:
   a sequencer for outputting address signals corresponding to a memory location;
   an address pipeline connected to said sequencer, said pipeline receiving the address signals and decoding the address signals into a word line address, said address pipeline driving an activation signal on a plurality of word lines corresponding to said word line address, said address pipeline comprising:
      a decode circuit, said decode circuit decoding the address signals into said word line address and driving said activation signal on said plurality of word lines, and
      first and second pipeline stages, said first pipeline stage receiving the address signals and outputting them to said decode circuit, said second pipeline stage being connected to said decode circuit by first word lines, receiving said activation signal from said decode circuit on said word line corresponding to said word line address and outputting a first pipelined activation signal to said register files;
   a plurality of register files having a memory array, each register file receiving said activation signal on a respective one of said plurality of word lines and accessing memory cells from its memory array at said memory location, each register file comprising a third pipeline stage comlected to said second pipeline stage by a plurality of second word lines, said third pipeline stage receiving said first pipelined activation signal and outputting a second pipelined activation signal on one of a plurality of third word lines; and
   a plurality of processor elements, each processor element connected to a respective register file,
   wherein said memory array receives said second pipelined activation signal from said third pipeline stage and accesses said memory cells based on said pipelined activation signal.

4. A processor system comprising:
   a processor; and
   a massively parallel processor device, said massively parallel processor device comprising:
      a sequencer for outputting address signals corresponding to a memory location,
      an address pipeline connected to said sequencer, said pipeline receiving the address signals and decoding the address signals into a word line address, said address pipeline driving an activation signal on a plurality of word lines corresponding to said word line address,
      a plurality of register files having a memory array, each register file receiving said activation signal on a respective one of said plurality of word lines and accessing memory cells from its memory array at said memory location, and
      a plurality of processor elements, each processor clement connected to a respective register file,
      wherein said address pipeline comprises:
         a decode circuit, said decode circuit decoding the address signals into said word line address and driving said activation signal on said plurality of word lines; and
         first and second pipeline stages, said first pipeline stage receiving the address signals and outputting them to said second pipeline stage, said second pipeline stage receiving the address signals from said first pipeline stage and outputting them to said decode circuit.

5. The processor system of claim 4, wherein each register file comprises:
   a third pipeline stage connected to said decode circuit by a plurality of first word lines, said third pipeline stage receiving said activation signal on a first word line corresponding to said word line address and outputting a pipelined activation signal on one of a plurality of second word lines, and
   wherein said memory array receives said pipelined activation signal from said third pipeline stage and accesses said memory cells based on said pipelined activation signal.

6. A processor system comprising:
   processor; and a massively parallel processor device, said massively parallel processor device comprising:

a sequencer for outputting address signals corresponding to a memory location, an address pipeline connected to said sequencer, said pipeline receiving the address signals and decoding the address signals into a word line address, said address pipeline driving an activation signal on a plurality of word lines corresponding to said word line address, wherein said address pipeline comprises:

a decode circuit, said decode circuit decoding the address signals into said word line address and driving said activation signal on said plurality of word lines; and first and second pipeline stages, said first pipeline stage receiving the address signals and outputting them to said decode circuit, said second pipeline stage being connected to said decode circuit by first word lines, receiving said activation signal from said decode circuit on said word line corresponding to said word line address and outputting a first pipelined activation signal, a plurality of register files having a memory array, each register file receiving said activation signal on a respective one of said plurality of word lines and accessing memory cells from its memory array at said memory location, each register file comprising a third pipeline stage connected to said second pipeline stage by a plurality of second word lines, said third pipeline stage receiving said first pipelined activation signal and outputting a second pipelined activation signal on one of a plurality of third word lines, and a plurality of processor elements, each processor element connected to a respective register file, wherein said memory array receives said second pipelined activation signal from said third pipeline stage and accesses said memory cells based on said pipelined activation signal.

7. A massively parallel processor device comprising:

an address pipeline comprising at least three pipeline stages and a decode circuit, one of said pipeline stages receiving address signals and outputting the signals to said decode circuit through at least a second of said at least three pipeline stages, said decode circuit decoding the address signals and providing an activation signal to another of said pipeline stages, said another pipeline stage receiving said activation signal and outputting a pipelined activation signal to access memory cells within a memory core, wherein at least one of said at least three pipeline stages is located in the memory core and the decode circuit is external to the core.

* * * * *

UNITED STATES PATENT AND TRADEMARK OFFICE
CERTIFICATE OF CORRECTION

PATENT NO.    : 6,483,767 B2
DATED         : November 19, 2002
INVENTOR(S)   : Graham Kirsch It is certified that error appears in the above-identified patent and that said Letters Patent is hereby corrected as shown below:

Column 1,
Line 16, "distribute" should read -- distributed --.

Column 8,
Line 12, "comlected" should read -- connected --.

Signed and Sealed this

Twenty-fifth Day of March, 2003

JAMES E. ROGAN
*Director of the United States Patent and Trademark Office*